United States Patent
Kang et al.

(10) Patent No.: US 8,114,689 B2
(45) Date of Patent: Feb. 14, 2012

(54) METHOD FOR MANUFACTURING LIGHT EMITTING DIODE CHIP AND LIGHT EMITTING DIODE LIGHT SOURCE MODULE

(75) Inventors: Eun Jeong Kang, Cheonan-si (KR); Gi Cherl Kim, Yongin-Si (KR); Moon Hwan Chang, Cheonan-Si (KR); Eun Chae Jeon, Suwon-Si (KR); Young Keun Lee, Cheonan-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/924,927

(22) Filed: Oct. 26, 2007

(65) Prior Publication Data

US 2008/0102541 A1 May 1, 2008

(30) Foreign Application Priority Data

Oct. 31, 2006 (KR) .................. 10-2006-0106463

(51) Int. Cl.
*H01L 21/00* (2006.01)

(52) U.S. Cl. ....... 438/25; 438/22; 438/26; 257/E21.237; 257/E27.121; 257/E33.06; 257/E33.059; 257/E33.061; 257/E33.073

(58) Field of Classification Search ............ 438/22, 438/25; 257/E21.237, E27.121, E33.06, 257/E33.061, E33.059, E33.073
See application file for complete search history.

(56) References Cited

U.S. PATENT DOCUMENTS

| | | | | |
|---|---|---|---|---|
| 5,110,388 A * | 5/1992 | Komiyama et al. | ........... | 156/229 |
| 5,612,513 A * | 3/1997 | Tuttle et al. | ................ | 174/260 |
| 5,834,339 A * | 11/1998 | Distefano et al. | ............. | 438/125 |
| 5,882,956 A * | 3/1999 | Umehara et al. | ............. | 438/114 |
| 6,225,139 B1 | 5/2001 | Tsung-Wen | | |
| 6,702,910 B2 * | 3/2004 | Noguchi et al. | ................. | 156/85 |
| 2003/0181122 A1* | 9/2003 | Collins et al. | ................... | 445/24 |
| 2005/0048681 A1* | 3/2005 | Yang | .............................. | 438/22 |
| 2005/0233546 A1* | 10/2005 | Oohata et al. | ................. | 438/458 |
| 2006/0028126 A1 | 2/2006 | Lifka et al. | | |
| 2006/0105484 A1* | 5/2006 | Basin et al. | ..................... | 438/27 |
| 2006/0105485 A1* | 5/2006 | Basin et al. | ..................... | 438/27 |
| 2006/0169994 A1* | 8/2006 | Tu et al. | .......................... | 257/89 |

(Continued)

FOREIGN PATENT DOCUMENTS

CN 1806346 7/2006

(Continued)

OTHER PUBLICATIONS

Office Action dated Apr. 13, 2010 from the Chinese Patent Office re: Application No. 200710305194.6.

*Primary Examiner* — Thao Le
*Assistant Examiner* — Eric Jones
(74) *Attorney, Agent, or Firm* — F. Chau & Associates LLC

(57) ABSTRACT

The present invention relates to a method for manufacturing a light emitting diode (LED) chip for a chip on board and a method for manufacturing an LED light source module in a chip on board fashion. The method of the present invention includes forming a plurality of LED chips on a wafer, molding a region of each LED chip, cutting the wafer into each LED chip, and testing each LED chip for operating characteristics.

10 Claims, 9 Drawing Sheets

U.S. PATENT DOCUMENTS

2007/0178629 A1 * 8/2007 Ogawa et al. ............... 438/113

FOREIGN PATENT DOCUMENTS

| | | |
|---|---|---|
| JP | 7202267 | 8/1995 |
| JP | 8125226 | 5/1996 |
| JP | 8204233 | 8/1996 |
| JP | 8316577 | 11/1996 |
| JP | 9045957 | 2/1997 |
| JP | 2002118289 | 4/2002 |
| JP | 2003309293 | 10/2003 |
| KR | 1020050004636 | 1/2005 |
| KR | 1020050012372 | 2/2005 |
| KR | 1020050030402 | 3/2005 |
| KR | 1020050090918 | 9/2005 |
| KR | 1020060010864 | 2/2006 |
| KR | 1020060083537 | 7/2006 |

* cited by examiner 100 (100u₁, 100u₂ ··· 100uₙ)

METHOD FOR MANUFACTURING LIGHT EMITTING DIODE CHIP AND LIGHT EMITTING DIODE LIGHT SOURCE MODULE

CROSS-REFERENCE TO RELATED APPLICATION

This application claims priority to Korean Patent Application No. 2006-106463 filed on Oct. 31, 2006, the disclosure of which is incorporated by reference in its entirety.

BACKGROUND OF THE INVENTION

1. Technical Field

The present invention relates to a method for manufacturing a light emitting diode (LED) chip and an LED light source module, and more particularly, to a method for manufacturing an LED chip for a chip on board (COB) and a method for manufacturing an LED light source module using the COB.

2. Discussion of the Related Art

As technologies for liquid crystal displays (LCDs) have been developed, needs for products with high color reproduction and environment-friendly characteristics are increased. Studies for products employing an LED backlight have been actively performed. An LED has long life, and low power consumption. The LED requires no additional inverter, and the LED can uniformly emit light. In addition, the LED is lightweight and thin. Therefore, the LED has been frequently used as backlight light sources for LCDs.

A backlight light source module is manufactured in various shapes including a bar shape or a circular shape, by packaging respective LED chips and mounting the LED packages on a printed circuit board in accordance with intended uses. However, when the respective LED packages are mounted to the printed circuit board, the total height of the backlight light source module is increased and the manufacturing costs are also increased. Since a plurality of interfacial surfaces each having different thermal and electrical characteristics overlap each other, a heat radiation or electrical resistance characteristic is lowered.

A 'chip on board' (COB) technique has been studied. LED chips are individually packaged and the LED packages are then mounted on a printed circuit board. In the COB technique, LED chips are directly mounted on a printed circuit board to reduce electrical and thermal losses in the interfacial surfaces. Accordingly, a more efficient LED light source module structure can be configured.

When the COB technique is used, material costs can be reduced and higher efficiency can also be achieved from even a smaller number of LEDs.

According to the COB technique, the characteristics of the respective LED chips can be evaluated only after the LED chips have been mounted on the printed circuit board. In order to obtain color uniformity and electrical uniformity of an LED light source module having a plurality of LED chips, the LED chips are mounted on a printed circuit board and then tested for their optical and electrical characteristics.

When there are any LED chips having desired characteristics, the undesired chips should be removed through a rework process. However, when the rework process has been completed, it is difficult to keep a normal shape of the printed circuit board and to obtain uniform optical and electrical characteristics of the LED light source module. Furthermore, the efficiency of productivity can be lowered due to the increase in manufacturing time and material costs.

SUMMARY OF THE INVENTION

Embodiments of the present invention provide a method for manufacturing an LED chip in such a manner that a binning process (corresponding to a process of testing chips for optical and electrical characteristics to classify the chips according to the characteristics) can be made before the chip is mounted to a printed circuit board, and a method for manufacturing an LED light source module using the LED chip manufactured by the LED chip manufacturing method.

According to an exemplary embodiment of the present invention, there is provided a method for manufacturing a light emitting diode (LED) chip, which comprises forming a plurality of LED chips on a wafer, molding a region of each LED chip, cutting the wafer into each LED chip, and testing each LED chip for operating characteristics.

Molding the region of each LED chip may comprise bonding the wafer on a release film, cutting the wafer into each LED chip, positioning the plurality of LED chips apart from each other, filling a gap between the plurality of LED chips with a resin; and curing the resin.

Positioning the plurality of LED chips apart from each other may comprise stretching the release film.

Filling the gap between the plurality of LED chips with a resin may comprise installing a resin guide on the release film to prevent flow of the resin, and filling a space defined by the resin guide with the resin.

Installing the resin guide on the release film to prevent flow of the resin may comprise installing the resin guide along a circumference of the wafer.

Molding the region of each LED chip may comprise molding regions other than at least p-type and n-type electrodes of each LED chip which includes an n-type semiconductor layer, an active layer, a p-type semiconductor layer, the p-type electrode formed on the p-type semiconductor layer, and the n-type electrode formed on the n-type semiconductor layer.

According to an exemplary embodiment of the present invention, there is provided a method for manufacturing an LED light source module, which comprises forming a plurality of LED chips on a wafer, primarily molding a region of each LED chip, cutting the primarily molded wafer into each LED chip, testing the each LED chip for operating characteristics, mounting at least one of the tested LED chips on a printed circuit board formed with a circuit pattern, and secondarily molding the LED chip.

Primary molding a region of each LED chip may comprise bonding the wafer on a release film, cutting the wafer into each LED chip, positioning the plurality of LED chips apart from each other, filling a spaced gap between the LED chips with a resin, and curing the resin.

Positioning the plurality of LED chips may comprise stretching the release film.

Filling the spaced gap between the LED chips with the resin may comprise installing a resin guide on the release film to prevent flow of the resin, and filling a space defined by the resin guide with the resin.

Installing the resin guide on the release film to prevent flow of the resin may comprise installing the resin guide along a circumference of the wafer.

Primary molding the region of each LED chip may comprise primarily molding regions other than at least p-type and n-type electrodes of each LED chip which includes an n-type semiconductor layer, an active layer, a p-type semiconductor layer, the p-type electrode formed on the p-type semiconductor layer, and the n-type electrode formed on the n-type semiconductor layer.

Mounting at least one of the tested LED chips on the printed circuit board formed with the circuit pattern may comprise bonding the LED chip on the printed circuit board, and wire bonding the LED chip to the circuit pattern for electrical connection between the chip and the circuit pattern.

Secondary molding the LED chip may comprise molding the LED chip using a resin mixed with fluorescent substances.

BRIEF DESCRIPTION OF THE DRAWINGS

Exemplary embodiments of the present invention can be understood in more detail from the following descriptions taken in conjunction with the accompanying drawings, in which.

DESCRIPTION OF THE EXEMPLARY EMBODIMENTS

Exemplary embodiments of the invention are described more fully hereinafter with reference to the accompanying drawings. This invention may, however, be embodied in many different forms and should not be construed as limited to the embodiments set forth herein.

FIGS. 1A, 2A, 3A, 4A, 5A and 6A and FIGS. 1B, 2B, 3B, 4B, 5B, 6B and 7 are plan and sectional views illustrating a process of manufacturing a light emitting diode (LED) chip according to an exemplary embodiment of the present invention, respectively.

Figure 1A:
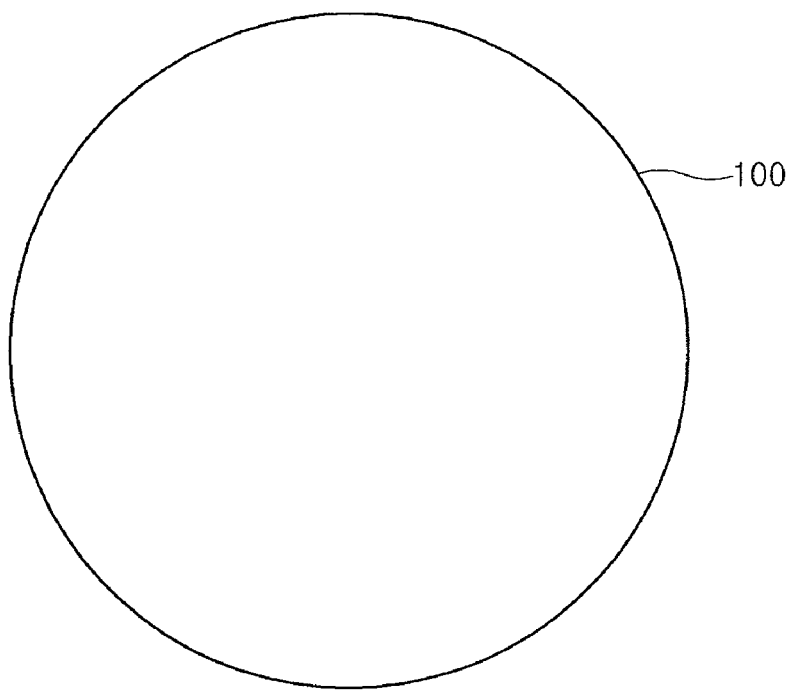
FIGS. 1A, 2A, 3A, 4A, 5A and 6A and FIGS. 1B, 2B, 3B, 4B, 5B, 6B and 7 are plan and sectional views illustrating a process of manufacturing a light emitting diode (LED) chip according to an exemplary embodiment of the present invention, respectively.
Figure 1B:
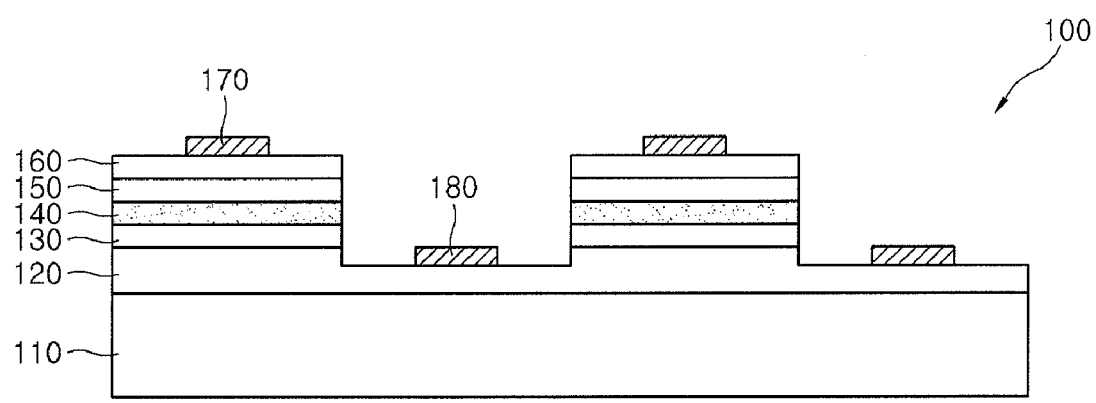

Referring to FIGS. 1A and 1B, a plurality of LED chips is formed on a wafer 100. The wafer 100 includes a plurality of LED chips, each of which includes an n-type semiconductor layer 120, an n-type clad layer 130, an active layer 140, a p-type clad layer 150, a p-type semiconductor layer 160, a p-type electrode 170, and an n-type electrode 180 formed on a substrate 110.

In an embodiment, a light emitting diode can be a semiconductor PN-junction diode. When P- and N-semiconductors are bonded to each other and supplied with a voltage, holes of the P-type semiconductor move toward the N-type semiconductor and are gathered in a middle layer, while electrons of the N-type semiconductor move toward the P-type semiconductor and are gathered in a middle layer that is the lowest layer in a conduction band. The electrons naturally drop into holes in a valence band. Energy corresponding to a difference in height between the conduction band and the valence band, i.e. an energy gap, is emitted in the form of light.

In an embodiment, the LED chip is formed by sequentially laminating the n-type semiconductor layer 120, the n-type clad layer 130, the active layer 140, the p-type clad layer 150 and the p-type semiconductor layer 160 on the substrate 110. A partial region of the n-type semiconductor layer 120 is exposed through an etching process, and the n-type electrode 180 is formed on the exposed region of the n-type semiconductor layer 120. Further, the p-type electrode 170 is formed on the p-type semiconductor layer 160. The n-type clad layer 130 and the p-type clad layer 150 efficiently confine electrons and holes within the active layer 140, so that efficiency of recombination of the electrons and holes can be increased. The n-type clad layer 130 and the p-type clad layer 150 may be omitted in some cases. A buffer layer may be further formed on the substrate 110 to reduce lattice mismatch.

In an embodiment, the substrate may include sapphire or silicon carbide and an LED chip is configured in such a manner that the p-type and n-type electrodes thereof are placed at the same surface. However, the present invention is not limited thereto. That is, the substrate may be formed of GaN or the like and the p-type and n-type electrodes are placed at the opposite surfaces.

Figure 2A:
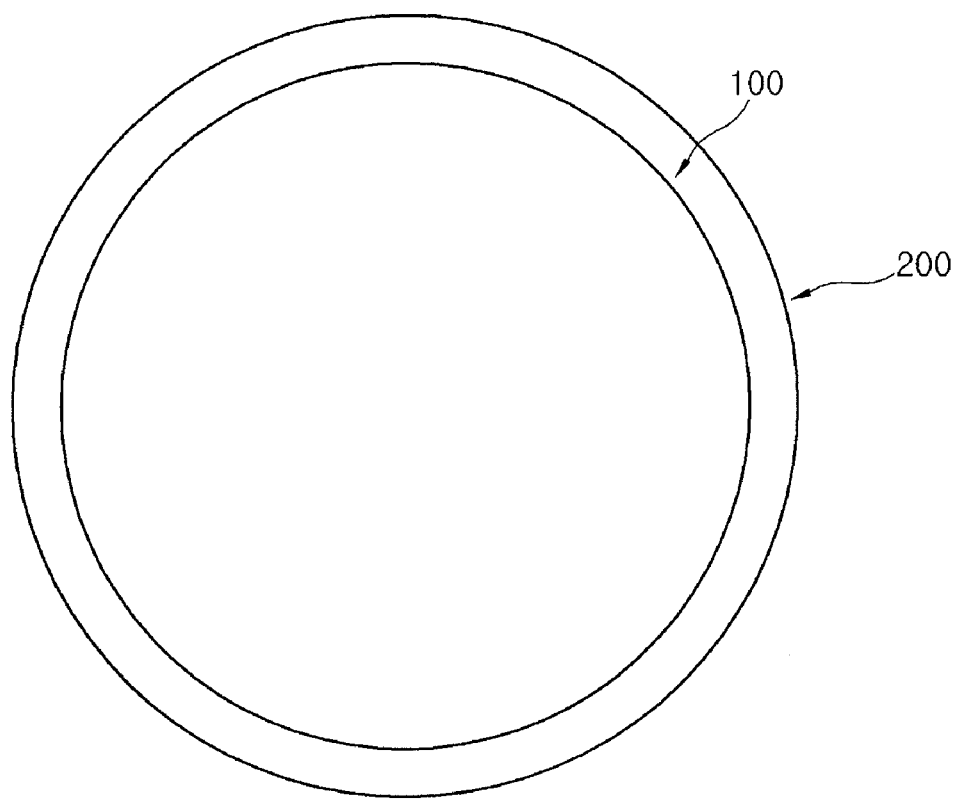
Figure 2B:
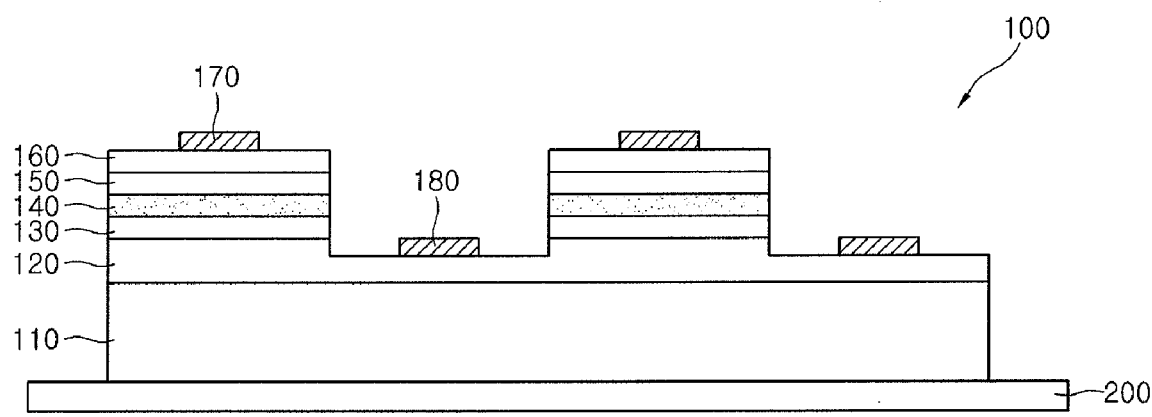

Referring to FIGS. 2A and 2B, a wafer 100 formed with a plurality of LED chips is bonded on a release film 200. The release film 200 is larger than the wafer 100 and does not necessarily correspond to the wafer 100 in their shapes. Further, the release film 200 may include, for example, plastic that can be elongated by heat or pressure.

Figure 3A:
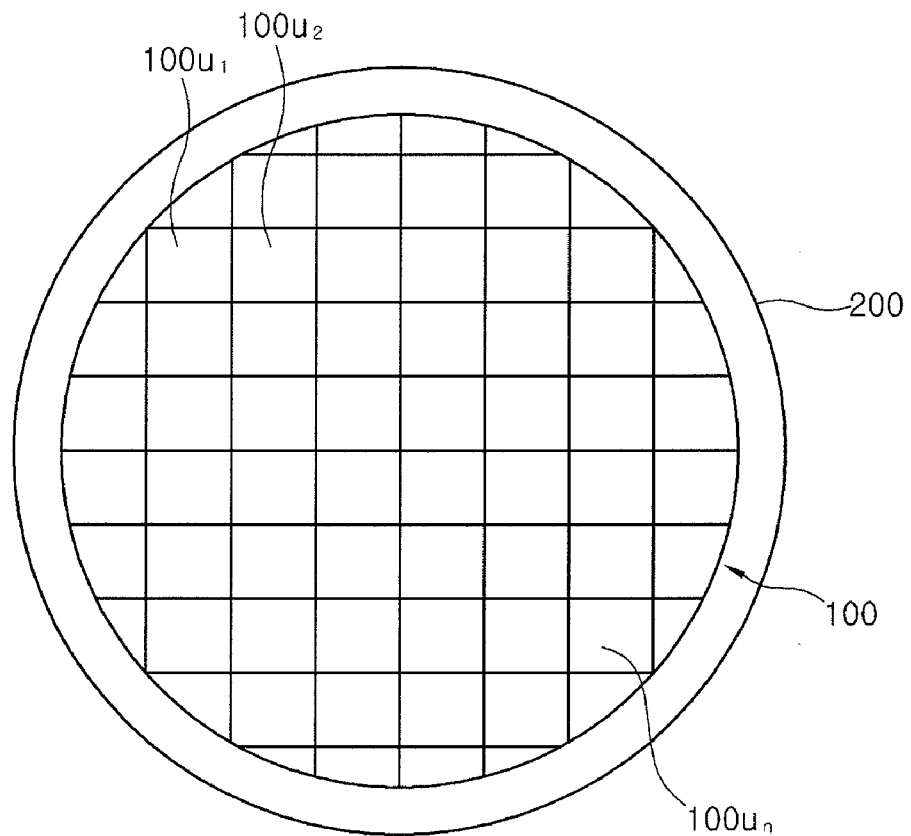
Figure 3B:
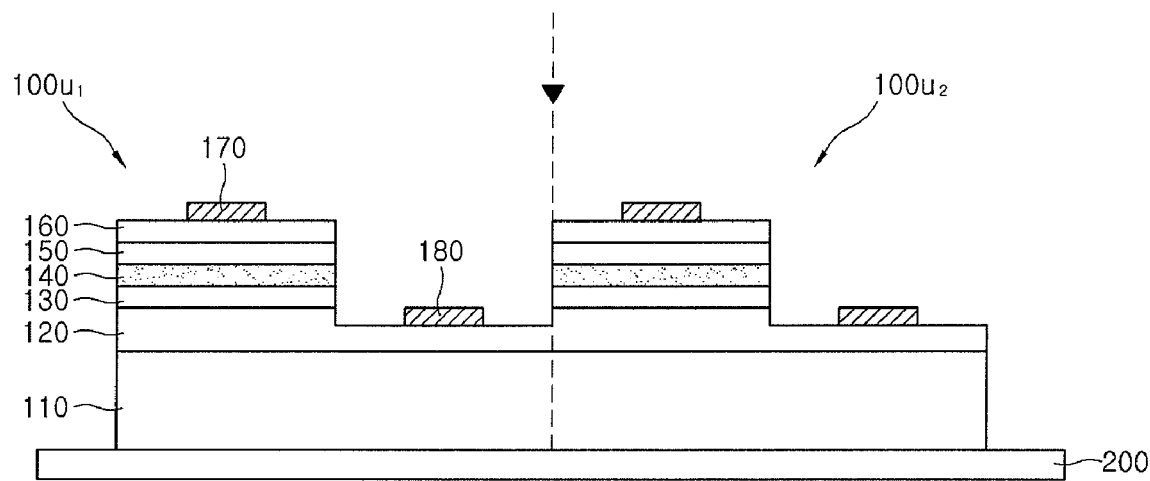

Referring to FIGS. 3A and 3B, the wafer 100 which is bonded to the release film 200 is cut into individual LED chips.

The wafer 100 formed with the plurality of LED chips is cut into each LED chip $100u_1$, $100u_2$, ..., $100u_n$ using a diamond wheel or laser beam. When the wafer 100 is cut into the each LED chip, it is not required that the release film 200 be cut. Alternatively, the release film 200 may be cut.

Figure 4A:
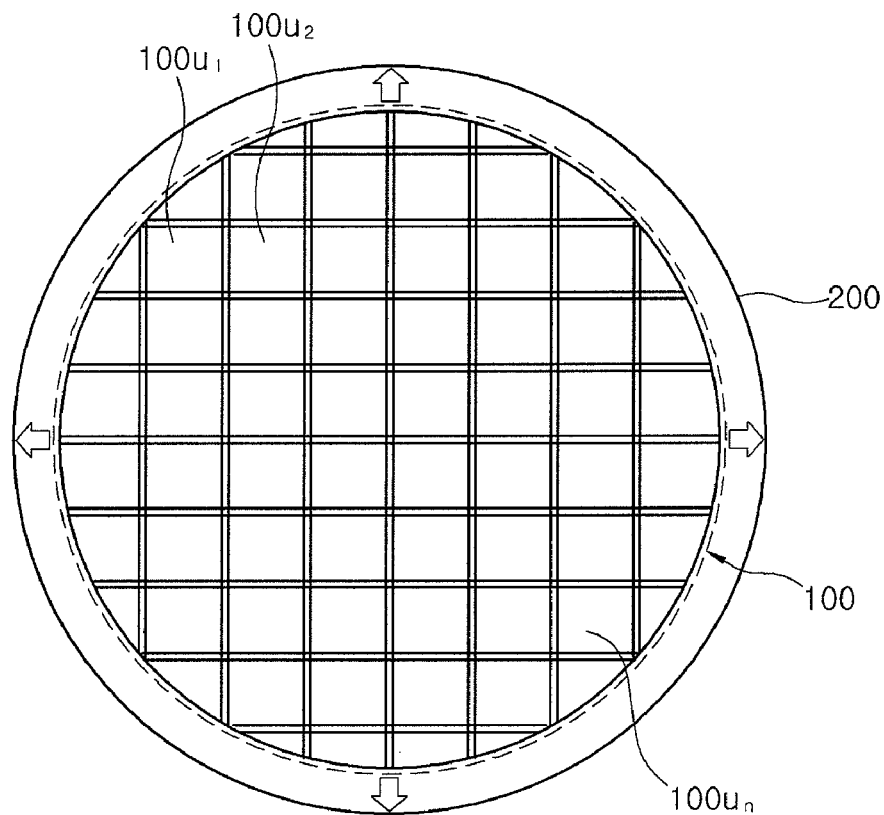
Figure 4B:
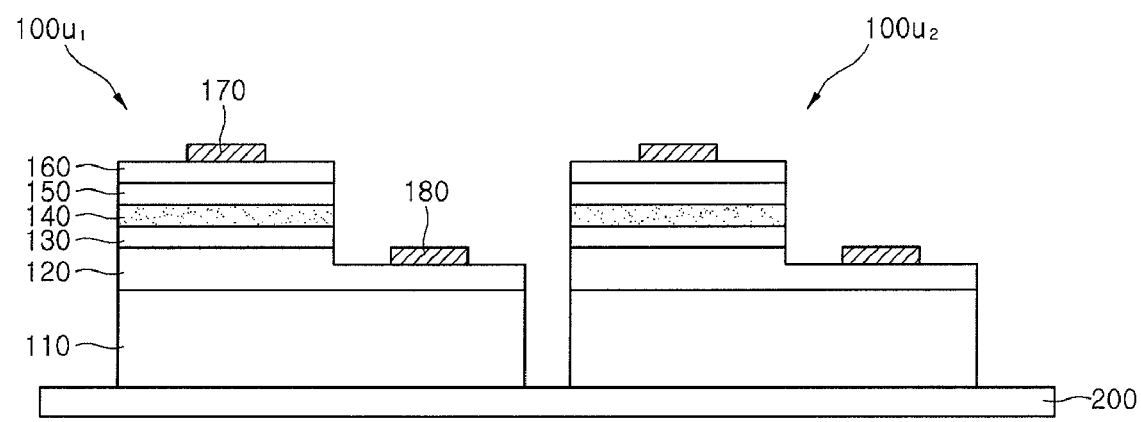

Referring to FIGS. 4A and 4B, in a state where the wafer 100 is cut into the each LED chip, and the release film 200 is not cut, the release film 200 is pulled and stretched in a radial direction such that the LED chips disposed on the release film 200 are positioned apart from each other.

The release film 200 may be elongated after being heated at a predetermined temperature but may be elongated without any additional heating process. Since the wafer is already cut into the each LED chip, the chips can be positioned apart from each other when the release film on which the chips are supported is stretched in a radial direction. A degree that the release film 200 is stretched may vary according to necessary intervals among the LED chips.

Figure 5A:
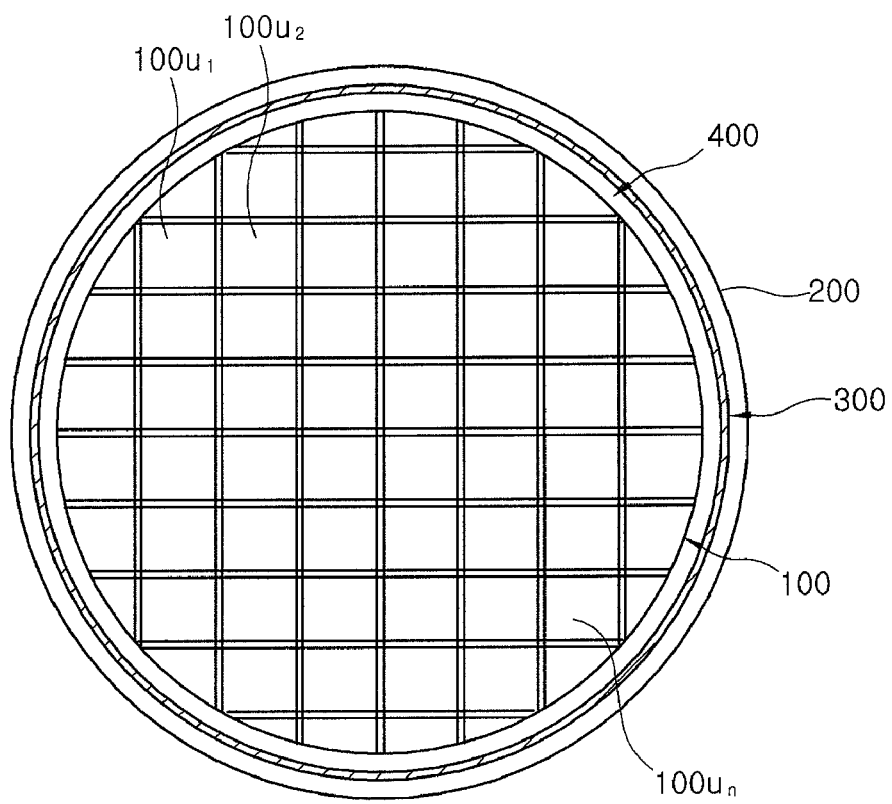
Figure 5B:
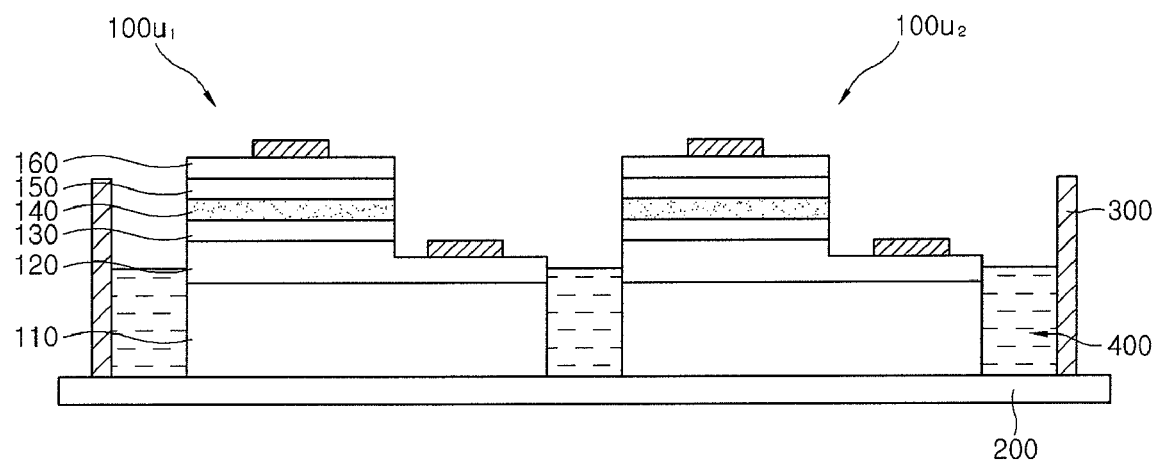

Referring to FIGS. 5A and 5B, a partial region of each LED chip is molded. A resin guide 300 is installed on the release film 200 and a space defined by the resin guide is filled with resin which in turn is cured to allow the predetermined region of each LED chip to be molded.

The resin guide 300 is installed along the circumference of the wafer 100 on the release film 200 at a predetermined interval from the wafer 100 to prevent the resin from flowing out of the wafer.

The resin filled in the space defined by the resin guide 300 may include a light transmissive resin such as a silicone resin and/or epoxy resin. Further, regions other than at least the p-type and n-type electrodes of each LED chip are molded with the resin. The reason is to perform a subsequent testing and wire bonding process.

Figure 6A:
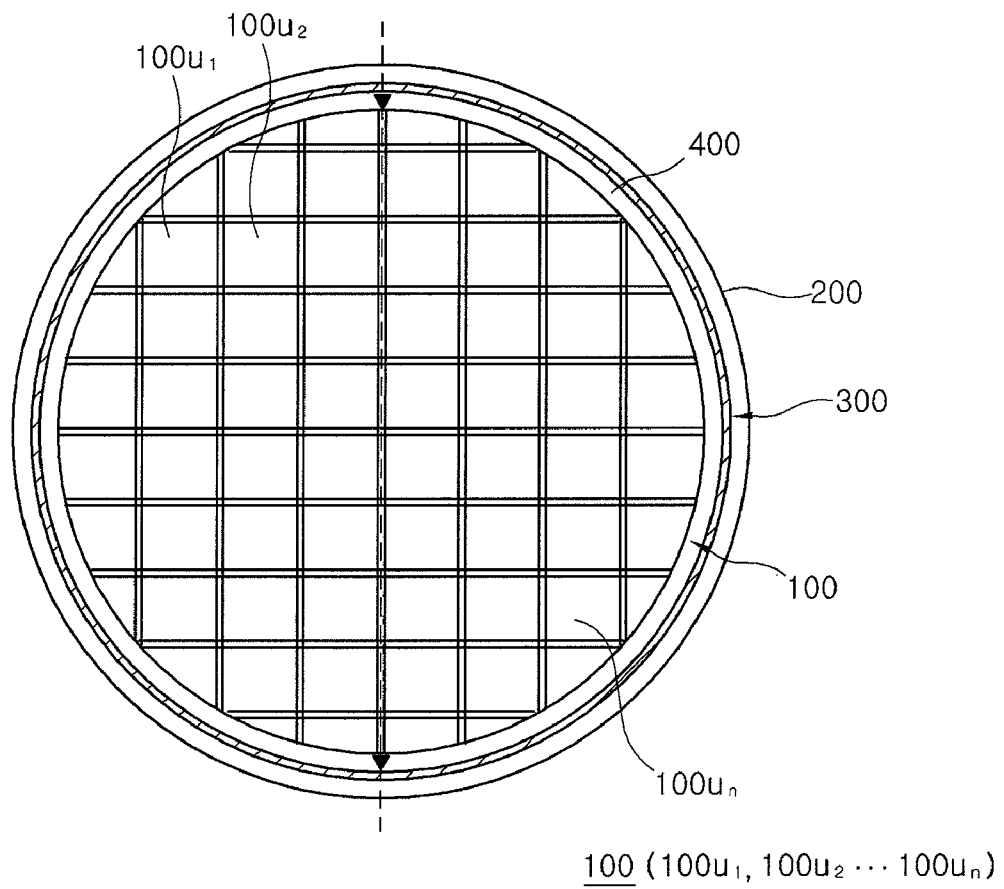
Figure 6B:
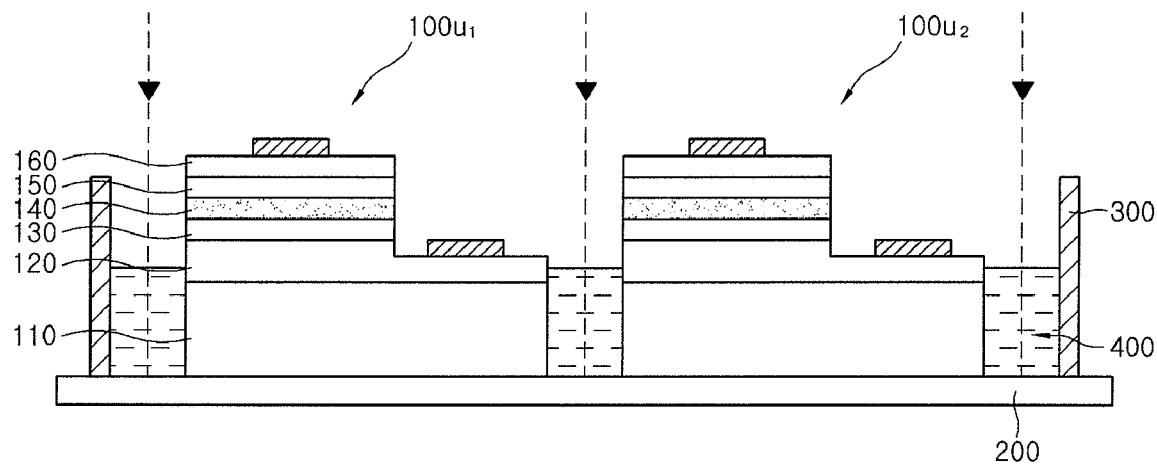

Referring to FIGS. 6A and 6B, the wafer formed with LED chips each having the predetermined molded region is cut into the respective LED chips using a diamond wheel or laser beam. As a result, the individual LED chip $100u_n$ includes the n-type semiconductor layer 120, the n-type clad layer 130, the active layer 140, the p-type clad layer 150, the p-type semiconductor layer 160, the p-type electrode 170 formed on the p-type semiconductor layer 160, the n-type electrode 180 formed on the exposed n-type semiconductor layer 120, and a first molding member 400 surrounding the regions excluding the p-type and n-type electrode 170 and 180, all of which are sequentially laminated on the substrate 110.

Figure 7:
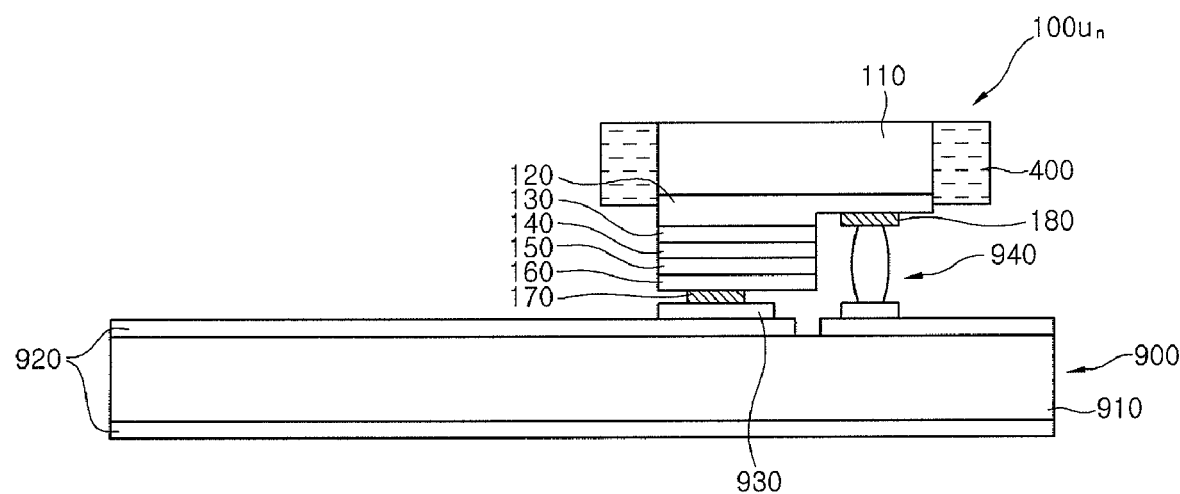

Referring to FIG. 7, each of the individual LED chips 100$u_n$ formed with the first molding member 400 is temporarily mounted on a test substrate 900 and then tested for its optical and electrical characteristics. LED chips with light uniformity and electrical characteristics similar to each other are grouped, and defective LED chips are additionally sorted. In this case, the test substrate 900 is composed of an insulating substrate 910, a circuit pattern 920 formed on the insulating substrate 910, and test pads 930 and 940 formed on the circuit pattern 920.

Figure 8:
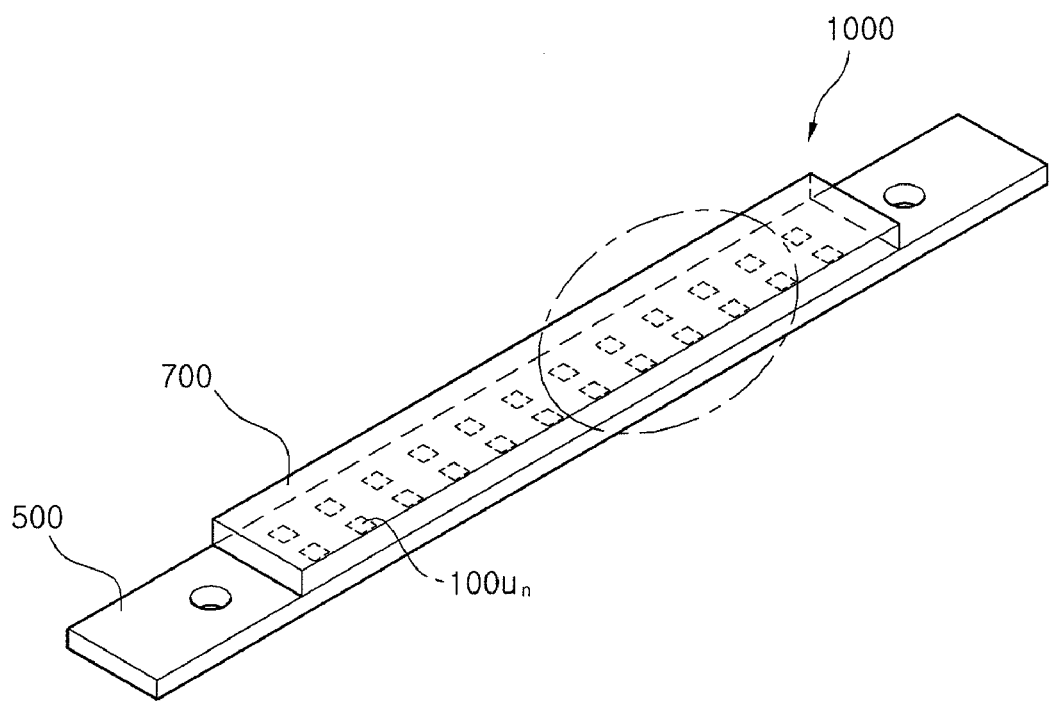
FIG. 8 is a schematic perspective view illustrating an LED light source module having LED chips according to an exemplary embodiment of the present invention.
Figure 9:
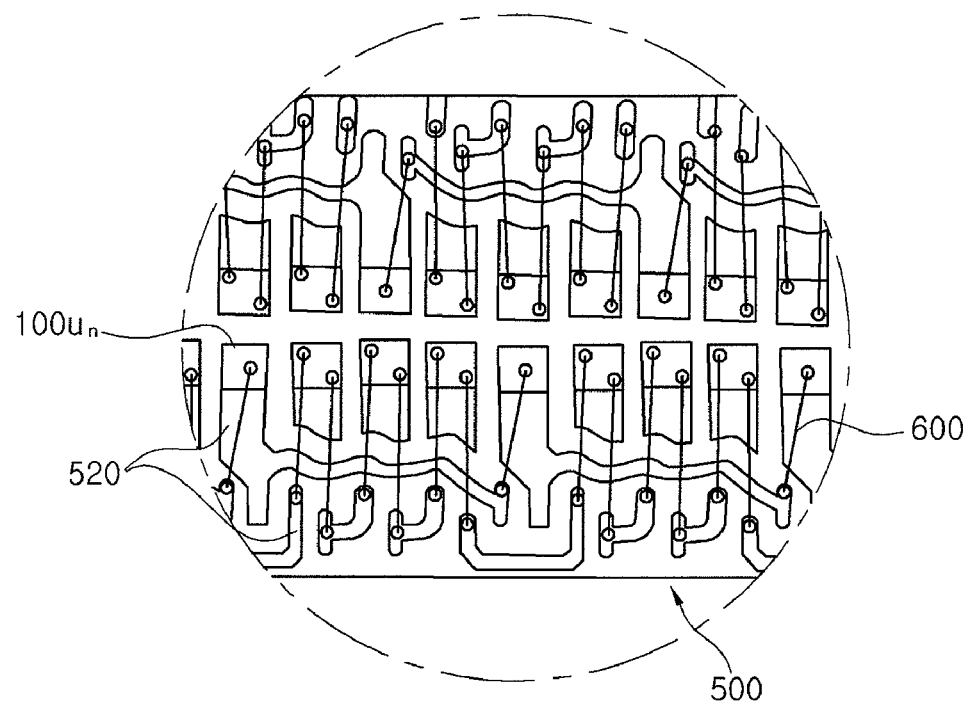
FIG. 9 is a partial expanded view illustrating the LED light source module in FIG. 8.

FIG. 8 is a schematic perspective view illustrating an LED light source module using LED chips manufactured according to an exemplary embodiment of the present invention, and FIG. 9 is an expanded view illustrating a dotted line portion of the LED light source module shown in FIG. 8.

Referring to FIGS. 8 and 9, the LED light source module 1000 comprises a printed circuit board 500 formed with a circuit pattern thereon, a plurality of LED chips 100$u_n$ mounted on the printed circuit board 500, and a second molding member 700 to seal the LED chips 100$u_n$.

The LED light source module 1000 according to an exemplary embodiment of the present invention is manufactured by directly mounting the LED chips 100$u_n$ manufactured by a process of manufacturing the LED chip shown in FIGS. 1A to 7 on the circuit pattern 520 of the printed circuit board 500 in a chip on board (COB) fashion, electrically connecting the LED chip to the circuit pattern 520 through wires 600, and forming the second molding member 700. The process of manufacturing the LED light source module will be described in more detail with reference to FIG. 10.

In an embodiment, the LED chips 100$u_n$ are mounted in two rows on the printed circuit board 500 in the form of a bar, and thus, the LED light source module 1000 is formed into a bar shape. However, the shape of the LED light source module 1000 and the number of the LED chips are not limited thereto but may be changed in various ways.

Figure 10A:
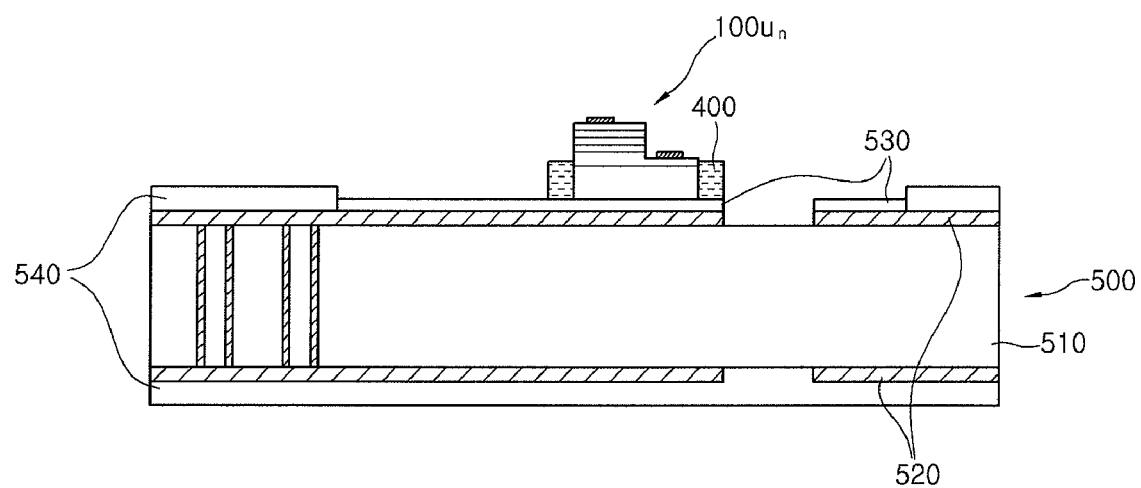
FIGS. 10A to 10C are sectional views illustrating a process of manufacturing an LED light source module using LED chips manufactured according to an exemplary embodiment of the present invention.
Figure 10B:
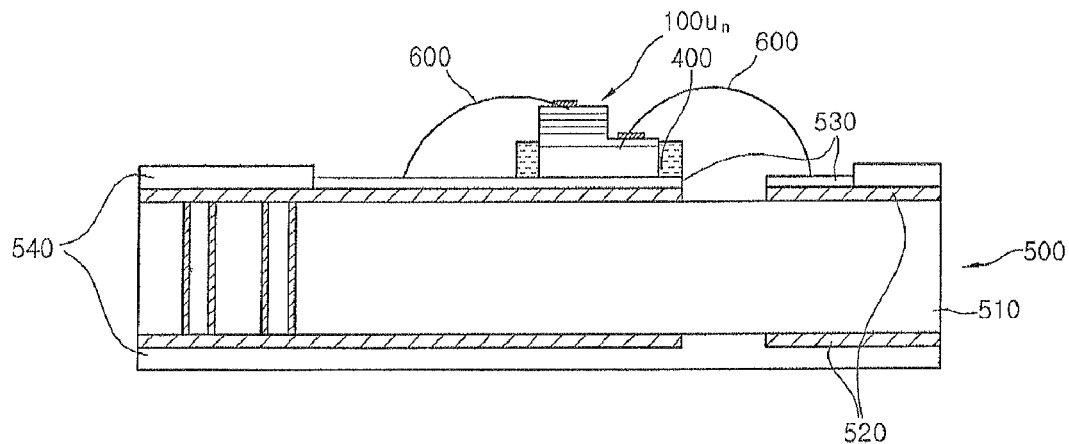
Figure 10C:
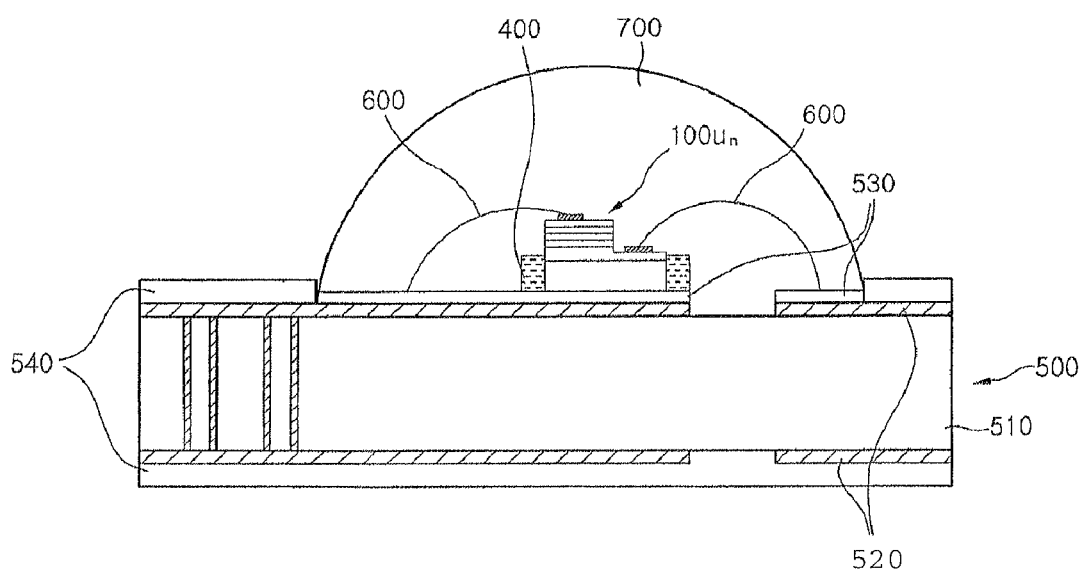

FIGS. 10A to 10C are sectional views illustrating a process of manufacturing an LED light source module using LED chips manufactured according to an exemplary embodiment of the present invention.

Referring to FIG. 10A, LED chips 100$u_n$ manufactured by the process of manufacturing LED chips shown in FIGS. 1 to 7 are die-bonded on the printed circuit board 500. The LED chips 100$u_n$ are individual LED chips each of which is formed with the first molding member 400. As described above, the LED chips 100$u_1$, are temporarily mounted on the test substrate 900 (See FIG. 7) and tested for optical and electrical characteristics. The LED chips with similar light uniformity and electrical characteristics can be grouped and then employed in the exemplary embodiments of the present invention.

This printed circuit board 500 includes an insulating substrate 510, a circuit pattern 520 formed on the insulating substrate 510, a reflecting layer 530 formed on at least one surface of the circuit patterns 520, and a protecting film 540 for protecting the circuit pattern 520. In an embodiment of the present invention, the circuit pattern 520 is formed on a top surface of the insulating substrate 510 and the reflecting layer 530 made of metal with good reflectance, for example, Ag is formed on the circuit pattern 520. Then, the LED chips 100$u$ are die-bonded on the reflecting layer 530. In addition to the printed circuit board illustrated in this embodiment by way of example, a variety of circuit boards may be used as a board for COB type mounting.

Referring to FIG. 10B, a wire bonding process is performed to electrically connect the electrodes of the LED chip 100$u_n$ to the circuit pattern 520 of the printed circuit board 500 through the wires 600.

Referring to FIG. 10C, a second molding member 700 is formed to protect the LED chips 100$u_n$. The second molding member 700 may include a light transmissive resin such as a silicone resin and/or epoxy resin. Further, the light transmissive resin may be mixed with fluorescent substances to change the wavelength of light emitted from the LED chips.

According to exemplary embodiments the present invention, at least a portion of each LED chip is molded to obtain the semi-packaged light emitting diodes. Thus, the LED chips can be tested for optical and electrical characteristics before the chips are mounted on the printed circuit board. Therefore, only LED chips with desired characteristics can be mounted on the printed circuit board, and thus, it is not necessary to perform the subsequent rework process. Since an LED light source module with uniform optical and electrical characteristics can be obtained and the rework process can also be omitted, the manufacturing time can be shortened and costs can also be reduced. Accordingly, the efficiency of productivity can be enhanced.

Although exemplary embodiments of the present invention have been described herein with reference to the accompanying drawings, it is to be understood that the present invention should not be limited to those precise embodiments and that various other changes and modifications may be made by one of ordinary skill in the related art without departing from the scope or spirit of the invention. All such changes and modifications are intended to be included within the scope of the invention as defined by the appended claims.

What is claimed is:

1. A method for manufacturing a light emitting diode (LED) chip comprising:
   forming a plurality of LED chips on a wafer;
   molding a region of each LED chip, wherein molding the region of each LED chip comprises:
      bonding the wafer on a release film prior to positioning the plurality of LED chips apart from each other;
      cutting the wafer into each LED chip, except for the release film;
      after bonding and cutting the wafer, stretching the release film to position the plurality of LED chips apart from each other;
      filling a gap between the plurality of LED chips with a resin, wherein filling the gap between the plurality of LED chips with the resin comprises installing a resin guide on the release film only along a circumference of the wafer, and wherein the plurality of LED chips are partially covered with the resin; and
      curing the resin, wherein each LED chip includes a p-type electrode and an n-type electrode, a filling height of the resin being under a top surface of each of the p-type and n-type electrodes;
   cutting the resin into each LED chip; and
   testing each LED chip.

2. The method of claim 1, wherein filling the gap between the plurality of LED chips with the resin further comprises:
   filling a space defined by the resin guide with the resin.

3. The method of claim 1, wherein each LED chip further includes an n-type semiconductor layer, an active layer, and a p-type semiconductor layer, the p-type electrode being formed on the p-type semiconductor layer, and the n-type electrode being formed on the n-type semiconductor layer.

4. The method of claim 3, wherein molding the region of each LED chip further comprises molding regions other than at least the p-type and the n-type electrodes of each LED chip.

5. A method for manufacturing an LED light source module, comprising:
    forming a plurality of LED chips on a wafer;
    primarily molding a region of each LED chip, wherein primarily molding the region of each LED chip comprises:
        bonding the wafer on a release film prior to positioning the plurality of LED chips apart from each other;
        cutting the wafer into each LED chip, except for the release film;
        after bonding and cutting the wafer, stretching the release film to position the plurality of LED chips apart from each other;
        filling a gap between the plurality of LED chips with a resin, wherein filling the gap between the plurality of LED chips with the resin comprises installing a resin guide on the release film only along a circumference of the wafer, and wherein the plurality of LED chips are partially covered with the resin; and
        curing the resin, wherein each LED chip includes a p-type electrode and an n-type electrode, a filling height of the resin being under a top surface of each of the p-type and n-type electrodes;
    cutting the resin into each LED chip;
    testing each LED chip;
    mounting at least one of the tested LED chips on a printed circuit board formed with a circuit pattern; and
    secondarily molding the LED chip.

6. The method of claim 5, wherein filling the gap between the LED chips with the resin comprises:
    filling a space defined by the resin guide with the resin.

7. The method of claim 5, wherein each LED chip further includes an n-type semiconductor layer, an active layer, and a p-type semiconductor layer, the p-type electrode being formed on the p-type semiconductor layer, and the n-type electrode being formed on the n-type semiconductor layer.

8. The method of claim 7, wherein primary molding the region of each LED chip further comprises primarily molding regions other than at least the p-type and the n-type electrodes of each LED chip.

9. The method of claim 5, wherein mounting at least one of the tested LED chips on a printed circuit board formed with a circuit pattern comprises:
    bonding the LED chip on the printed circuit board; and
    wire bonding the LED chip to the circuit pattern.

10. The method of claim 5, wherein secondary molding the LED chip comprises molding the LED chip using a resin mixed with fluorescent substances.

* * * * *